(12) United States Patent  
Jeddeloh

(10) Patent No.: US 8,797,818 B2
(45) Date of Patent: *Aug. 5, 2014

(54) VARIABLE MEMORY REFRESH DEVICES AND METHODS

(75) Inventor: Joe M. Jeddeloh, Shoreview, MN (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/493,651

(22) Filed: Jun. 11, 2012

(65) Prior Publication Data

US 2012/0250388 A1   Oct. 4, 2012

Related U.S. Application Data

(63) Continuation of application No. 13/088,821, filed on Apr. 18, 2011, now Pat. No. 8,199,599, which is a continuation of application No. 12/346,542, filed on Dec. 30, 2008, now Pat. No. 7,929,368.

(51) Int. Cl.
  *G11C 7/00* (2006.01)
  *G11C 11/406* (2006.01)
  *G11C 11/4097* (2006.01)

(52) U.S. Cl.
  CPC ........ *G11C 11/406* (2013.01); *G11C 11/40626* (2013.01); *G11C 11/4097* (2013.01); *G11C 2211/4061* (2013.01)
  USPC ........................ 365/222; 365/201; 365/230.06

(58) Field of Classification Search
  CPC ............. G11C 11/406; G11C 11/4097; G11C 2211/4061
  USPC ........... 365/222, 201, 230.06, 230.08, 189.05
  See application file for complete search history.

(56) References Cited

U.S. PATENT DOCUMENTS

| 6,195,304 | B1 | 2/2001 | Eto et al. |
| 6,199,139 | B1 | 3/2001 | Katayama et al. |
| 6,247,104 | B1 | 6/2001 | Suzuki |
| 6,567,950 | B1 | 5/2003 | Bertin et al. |
| 6,603,696 | B2 * | 8/2003 | Janzen ........................ 365/222 |
| 6,658,078 | B2 | 12/2003 | Anegawa et al. |
| 7,107,383 | B1 | 9/2006 | Rajan |

(Continued)

FOREIGN PATENT DOCUMENTS

| CN | 1468399 A | 1/2004 |
| CN | 1710519 A | 12/2005 |

(Continued)

OTHER PUBLICATIONS

"European Application Serial No. 09837176.8, Extended EP Search Report mailed Oct. 4, 2012", 8 pgs.

(Continued)

*Primary Examiner* — Gene Auduong
(74) *Attorney, Agent, or Firm* — Schwegman, Lundberg & Woessner, P.A.

(57) ABSTRACT

Memory devices and methods are described such as those that monitor and adjust characteristics for various different portions of a given memory device. Examples of different portions include tiles, or arrays, or dies. One memory device and method described includes monitoring and adjusting characteristics of different portions of a 3D stack of memory dies. One characteristic that can be adjusted at multiple selected portions includes refresh rate.

17 Claims, 5 Drawing Sheets

(56) References Cited

U.S. PATENT DOCUMENTS

| | | | |
|---|---|---|---|
| 7,543,106 B2 * | 6/2009 | Choi | 711/106 |
| 7,545,698 B2 | 6/2009 | Safvi et al. | |
| 7,929,368 B2 | 4/2011 | Jeddeloh | |
| 7,975,170 B2 * | 7/2011 | Hummler et al. | 365/222 |
| 8,018,752 B2 | 9/2011 | Jeddeloh | |
| 8,127,185 B2 * | 2/2012 | Jeddeloh | 714/723 |
| 8,199,599 B2 | 6/2012 | Jeddeloh | |
| 8,392,771 B2 * | 3/2013 | Jeddeloh | 714/723 |
| 2003/0067826 A1 | 4/2003 | Janzen | |
| 2005/0146919 A1 | 7/2005 | Ellis et al. | |
| 2007/0106838 A1 | 5/2007 | Choi | |
| 2008/0028136 A1 | 1/2008 | Schakel | |
| 2008/0031067 A1 | 2/2008 | Lovett | |
| 2008/0056014 A1 | 3/2008 | Rajan et al. | |
| 2008/0103753 A1 | 5/2008 | Rajan et al. | |
| 2008/0130156 A1 | 6/2008 | Chu et al. | |
| 2010/0091537 A1 | 4/2010 | Best et al. | |
| 2010/0165692 A1 | 7/2010 | Jeddeloh | |
| 2010/0191999 A1 | 7/2010 | Jeddeloh | |
| 2010/0192041 A1 | 7/2010 | Jeddeloh | |
| 2011/0167319 A1 | 7/2011 | Jeddeloh | |
| 2011/0194369 A1 | 8/2011 | Jeddeloh | |

FOREIGN PATENT DOCUMENTS

| | | |
|---|---|---|
| CN | 102272849 A | 12/2011 |
| EP | 0851427 A2 | 7/1998 |
| JP | 04060988 | 2/1992 |
| JP | 11213659 | 8/1999 |
| JP | 2002025299 A | 1/2002 |
| JP | 2002133861 A | 5/2002 |
| JP | 2005216429 A | 8/2005 |
| JP | 2006120144 A | 5/2006 |
| JP | 2006518532 A | 8/2006 |
| WO | WO-2004019340 A1 | 3/2004 |
| WO | WO-2007028109 A2 | 3/2007 |
| WO | WO-2010078454 | 7/2010 |
| WO | WO-2010078454 A1 | 7/2010 |

OTHER PUBLICATIONS

Chinese Application Serial No. 200980153463.9, Office Action mailed Aug. 1, 2013, 8 pgs.

Japanese Application Serial No. 2011-543731, Office Action mailed Aug. 6, 2013, 6 pgs.

Taiwanese Application Serial No. 098145171, Office Action mailed May 21, 2013, 26 pgs.

Taiwanese Application Serial No. 098145171, Response filed Aug. 23, 2013 to Office Action mailed May 21, 2013, 13 pgs.

Chinese Application Serial No. 200980153463.9, Response filed Dec. 9, 2013 to Office Action mailed Aug. 1, 2013, 10 pgs.

Taiwanese Application Serial No. 098145171, Office Action mailed Oct. 22, 2013, 7 pgs.

* cited by examiner

US 8,797,818 B2

VARIABLE MEMORY REFRESH DEVICES AND METHODS

PRIORITY APPLICATION

This application is a continuation of U.S. application Ser. No. 13/088,821, filed Apr. 18, 2011 now U.S. Pat. No. 8,199,599, which is a continuation of U.S. application Ser. No. 12/346,542, filed Dec. 30, 2008, now issued as U.S. Pat. No. 7,929,368, both of which are incorporated herein by reference in their entirety.

TECHNICAL FIELD

Various embodiments described herein relate to apparatus, systems, and methods associated with semiconductor memories.

BACKGROUND

Microprocessor technology has evolved at a faster rate than that of semiconductor memory technology. As a result, a mis-match in performance often exists between the modern host processor and the semiconductor memory subsystem to which the processor is mated to receive instructions and data. For example, it is estimated that some high-end servers idle three out of four clock cycles waiting for responses to memory requests.

In addition, the evolution of software application and operating system technology has increased demand for higher-density memory subsystems as the number of processor cores and threads continues to increase. However, current-technology memory subsystems often represent a compromise between performance and density. Higher bandwidths may limit the number of memory cards or modules that may be connected in a system without exceeding Joint Electron Device Engineering Council (JEDEC) electrical specifications.

Extensions to JEDEC interface standards such as dynamic data rate (DDR) synchronous dynamic random access memory (SDRAM) have been proposed but may be generally found lacking as to future anticipated memory bandwidths and densities. Weaknesses include lack of memory power optimization and the uniqueness of the interface between the host processor and the memory subsystem. The latter weakness may result in a need to redesign the interface as processor and/or memory technologies change.

DETAILED DESCRIPTION

In the following detailed description of the invention, reference is made to the accompanying drawings that form a part hereof and in which is shown, by way of illustration, specific embodiments in which the invention may be practiced. These embodiments are described in sufficient detail to enable those skilled in the art to practice the invention. Other embodiments may be utilized and structural, logical, and electrical changes may be made.

Figure 1:
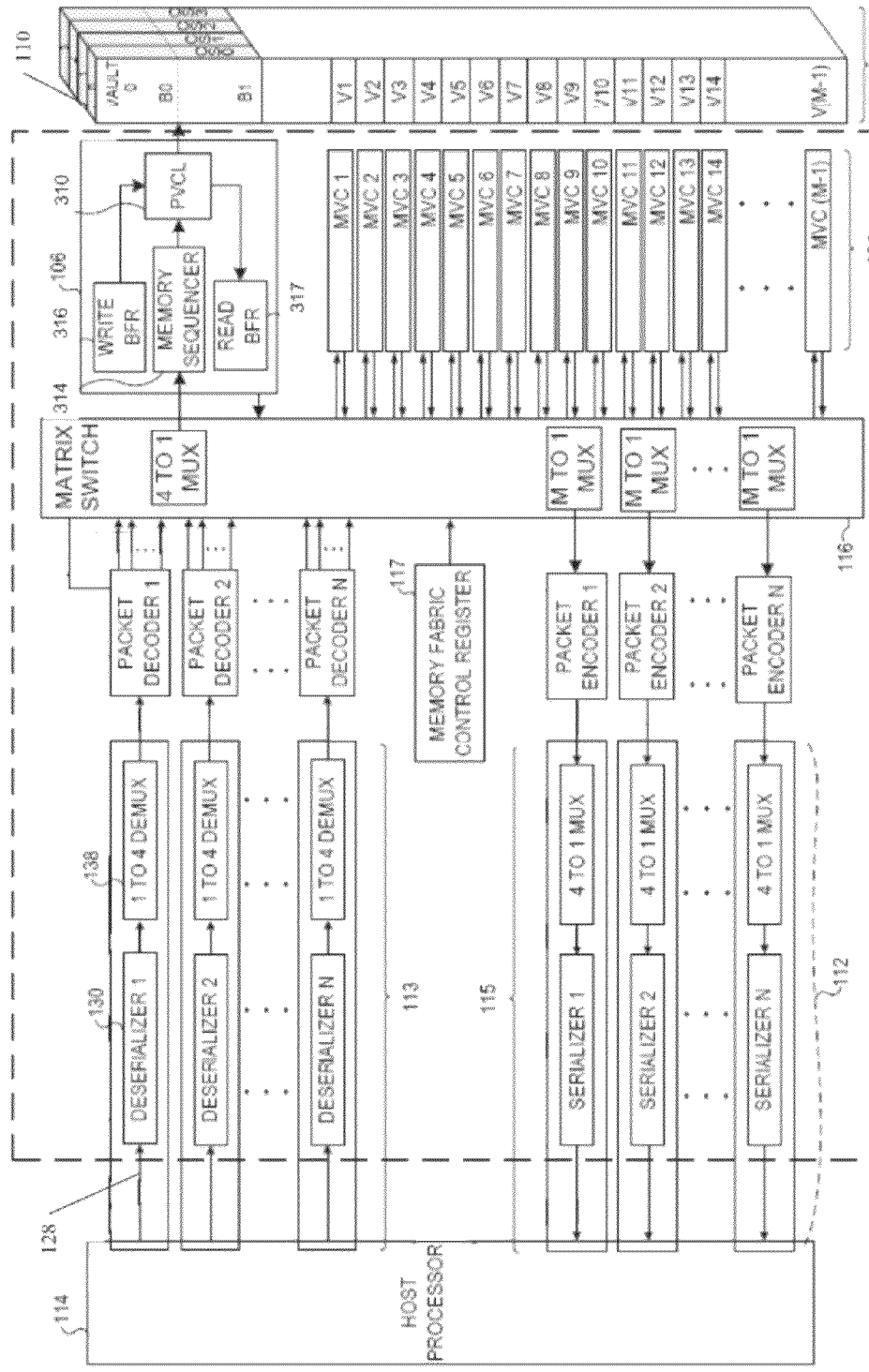
FIG. 1 shows a block diagram of a memory system according to an embodiment of the invention.

FIG. 1 includes a block diagram of a memory device 100 according to various example embodiments of the current invention. The memory device 100 operates to substantially concurrently transfer a plurality of outbound and/or inbound streams of commands, addresses, and/or data between one or more originating devices and/or destination devices (e.g., one or more processors) and a set of stacked-array memory "vaults" 110. Increased memory system density, bandwidth, parallelism, and scalability may result.

Multi-die memory array embodiments aggregate control logic that is normally located on each individual memory array die in previous designs. Subsections of a stacked group of dies, referred to in the present disclosure as memory vaults are shown as example vault 110 in FIG. 1 example vault 230 in FIG. 2. The memory vaults shown in the illustrated examples share common control logic. The memory vault architecture strategically partitions memory control logic to increase energy efficiency while providing a finer granularity of powered-on memory banks. Embodiments shown also enable a standardized host processor to memory system interface. The standardized interface may reduce re-design cycle times as memory technology evolves.

Figure 2:
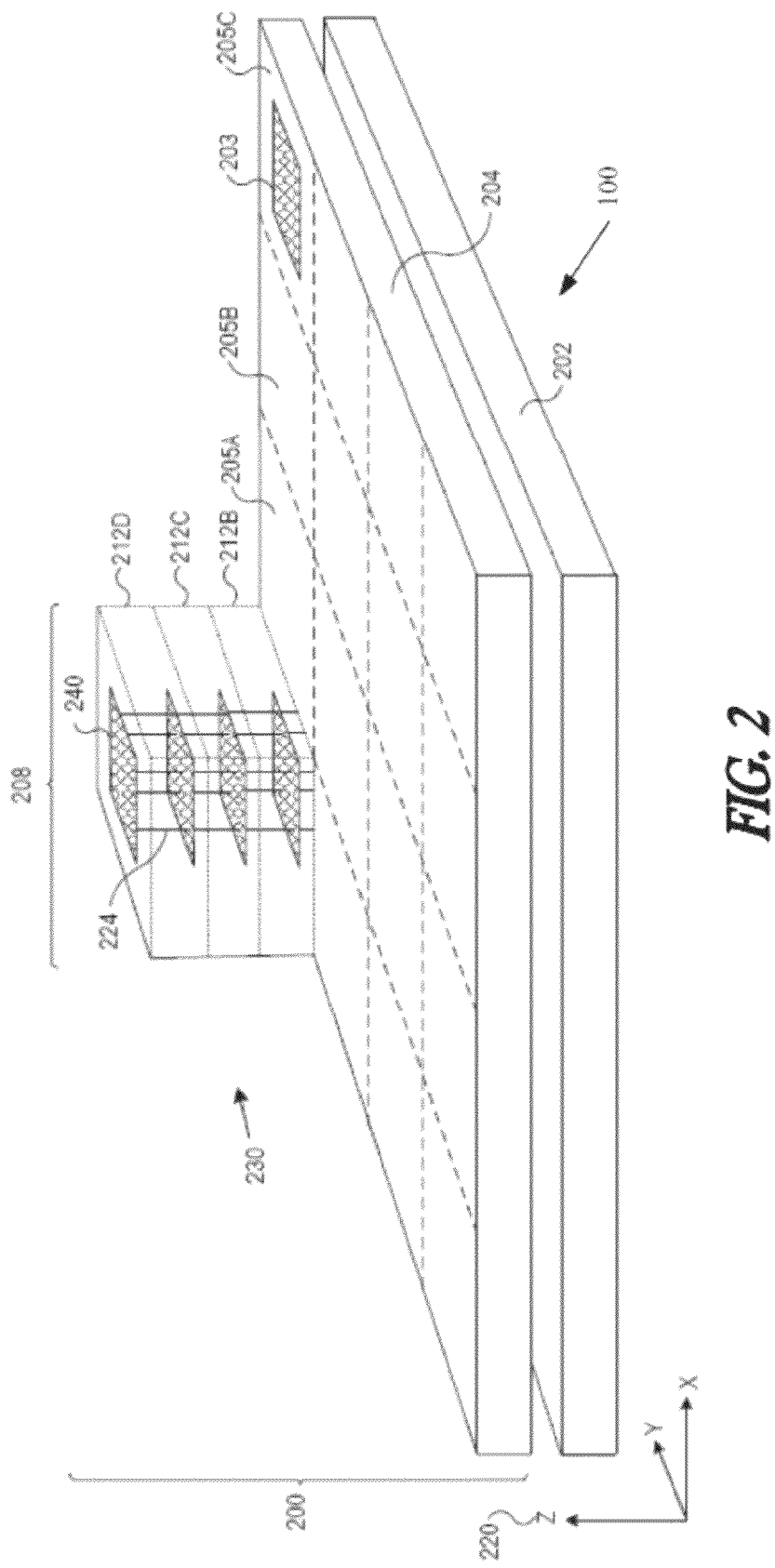
FIG. 2 shows a cut-away conceptual view of a stacked-die 3D memory array stacked with a logic die according to an embodiment of the invention.

FIG. 2 is a cut-away conceptual view of a stacked-die 3D memory array 200 stacked with a logic die 202 to form a memory device 100 according to various example embodiments. The memory device 100 incorporates one or more stacks of tiled memory arrays 203 resulting in the stacked-die 3D memory array 200. Multiple memory arrays (e.g., the memory array 203) are fabricated onto each of a plurality of dies (e.g., the die 204). The memory array dies are then stacked to form the stacked-die 3D memory array 200.

Each of the stacked dies is divided into multiple "tiles" (e.g., the tiles 205A, 205B, and 205C associated with the stacked die 204). Each tile (e.g., the tile 205C) may include one or more memory arrays 203. The memory arrays 203 are not limited to any particular memory technology and may include dynamic random-access memory (DRAM), static random access memory (SRAM), flash memory, etc.

A stacked set of memory array tiles 208 may include a single tile from each of the stacked dies (e.g., the tiles 212B, 212C and 212D, with the base tile hidden from view in FIG. 1). Power, address, and/or data and similar common signals may traverse the stacked set of tiles 208 in the "Z" dimension 220 on conductive paths (e.g., the conductive path 224), such as "through-wafer interconnects" (TWIs). It is noted that a TWI need not necessarily pass entirely through a particular wafer or die.

The stacked-die 3D memory array 200 is thus partitioned into a set of memory "vaults" (e.g., the memory vault 230). Each memory vault includes a stacked set of tiles (e.g., the set of tiles 208), one tile from each of a plurality of stacked dies, together with a set of TWIs to electrically interconnect the set of tiles 208. Each tile of the vault includes one or more memory arrays (e.g., the memory array 240).

A resulting set of memory vaults 102, similar to the memory vaults 230 from FIG. 2, is illustrated in FIG. 1 in context within the memory device 100. The memory device 100 also includes a plurality 104 of memory vault controllers (MVCs) (e.g., the MVC 106). Each MVC is communicatively coupled to a corresponding memory vault (e.g., the memory vault 110 of the set 102) in a one-to-one relationship. Each MVC is thus capable of communicating with a corresponding memory vault independently from communications between other MVCs and their respective memory vaults.

The memory device 100 also includes a plurality of configurable serialized communication link interfaces (SCLIs) 112. The SCLIs 112 are divided into an outbound group of SCLIs 113 and an inbound group of SCLIs 115, where "outbound" and "inbound" directions are defined form the perspective of the processor(s) 114. Each of the plurality of SCLIs 112 is capable of concurrent operation with the other SCLIs 112. Together the SCLIs 112 communicatively couple the plurality of MVCs 104 to one or more host processor(s) 114. The memory device 100 presents a highly abstracted, multi-link, high-throughput interface to the host processor(s) 114.

The memory device 100 may also include a switch 116. In some embodiments, the switch 116 may comprise a matrix switch which might also be referred to as a cross connect switch. The switch 116 is communicatively coupled to the plurality of SCLIs 112 and to the plurality of MVCs 104. The switch 116 is capable of cross-connecting each SCLI to a selected MVC. The host processor(s) 114 may thus access the plurality of memory vaults 102 across the plurality of SCLIs 112 in a substantially simultaneous fashion. This architecture can provide high processor-to-memory bandwidth for modern processor technologies, including multi-core technologies.

The memory device 100 may also include a memory fabric control register 117 coupled to the switch 116. The memory fabric control register 117 accepts memory fabric configuration parameters from a configuration source and configures one or more components of the memory device 100 to operate according to a selectable mode. For example, the switch 116 and each of the plurality of memory vaults 102 and the plurality of MVCs 104 may normally be configured to operate independently of each other in response to separate memory requests. Such a configuration can enhance memory system bandwidth as a result of the parallelism between the SCLIs 112 and the memory vaults 102.

Alternatively, the memory device 100 may be reconfigured via the memory fabric control register 117 to cause a subset of two or more of the plurality of memory vaults 102 and a corresponding subset of MVCs to operate synchronously in response to a single request. The latter configuration may be used to access a data word that is wider than the width of a data word associated with a single vault. This technique may decrease latency. Other configurations may be enabled by loading a selected bit pattern into the memory fabric control register 117.

In one example the outbound SCLIs 113 may include a plurality of outbound differential pair serial paths (DPSPs) 128. The DPSPs 128 are communicatively coupled to the host processor(s) 114 and may collectively transport an outbound packet. The outbound SCLI 113 may also include a deserializer 130 coupled to the plurality of outbound DPSPs 128. The outbound SCLI may also include a demultiplexer 138 communicatively coupled to the deserializer 130. In one embodiment, the configuration of DSPSs, deserializers, and demultiplexers facilitates efficient transfer of data packets or sub-packets. Similar to the outbound SLCIs, in one embodiment, the inbound SCLIs and a similar configuration of DSPSs, serializers, and multiplexers facilitate efficient transfer of data packets or sub-packets.

Figure 3:
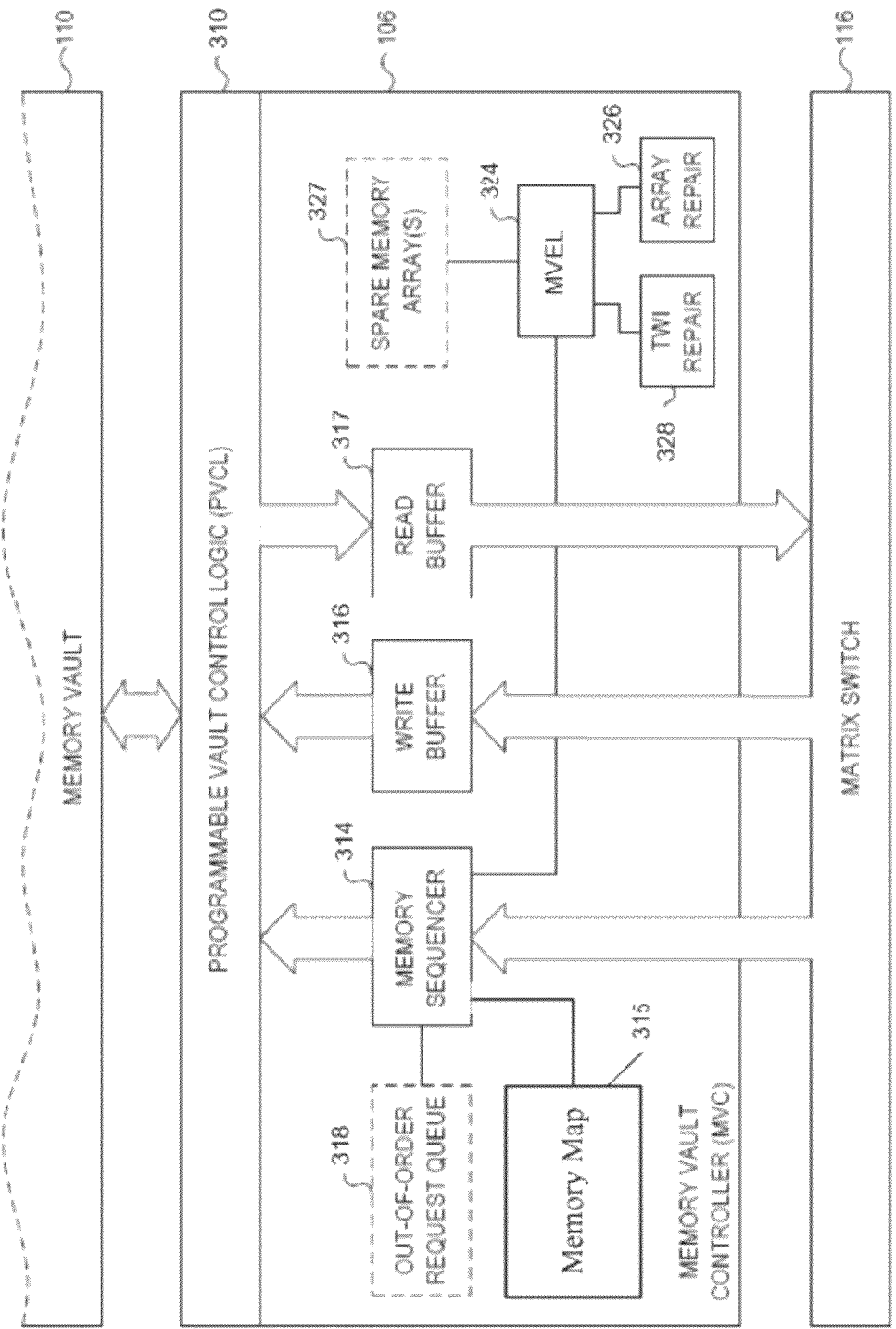
FIG. 3 shows a block diagram of a memory vault controller and associated modules according to an embodiment of the invention.

FIG. 3 is a block diagram of an MVC (e.g., the MVC 106) and associated modules according to various example embodiments. The MVC 106 may include a programmable vault control logic (PVCL) component 310. The PVCL 310 interfaces the MVC 106 to the corresponding memory vault (e.g., the memory vault 110). The PVCL 310 generates one or more control signals and/or timing signals associated with the corresponding memory vault 110.

The PVCL 310 may be configured to adapt the MVC 106 to a memory vault 110 of a selected configuration or a selected technology. Thus, for example, the memory device 100 may initially be configured using currently-available DDR2 DRAMs. The memory device 100 may subsequently be adapted to accommodate DDR3-based memory vault technology by reconfiguring the PVCL 310 to include DDR3 bank control and timing logic.

The MVC 106 may also include a memory sequencer 314 communicatively coupled to the PVCL 310. The memory sequencer 314 performs a memory technology dependent set of operations based upon the technology used to implement the associated memory vault 110. The memory sequencer 314 may, for example, perform command decode operations, memory address multiplexing operations, memory address demultiplexing operations, memory refresh operations, memory vault training operations, and/or memory vault prefetch operations associated with the corresponding memory vault 110. In some embodiments, the memory sequencer 314 may comprise a DRAM sequencer. In some embodiments, memory refresh operations may originate in a separate refresh controller (not shown). Other memory refresh operations are described in more detail below.

The memory sequencer 314 may be configured to adapt the memory device 100 to a memory vault 110 of a selected configuration or technology. For example, the memory sequencer 314 may be configured to operate synchronously with other memory sequencers associated with the memory device 100. Such a configuration may be used to deliver a wide data word from multiple memory vaults to a cache line (not shown) associated with the host processor(s) 114 in response to a single cache line request.

The MVC 106 may also include a write buffer 316. The write buffer 316 may be coupled to the PVCL 310 to buffer data arriving at the MVC 106 from the host processor(s) 114. The MVC 106 may further include a read buffer 317. The read buffer 317 may be coupled to the PVCL 310 to buffer data arriving at the MVC 106 from the corresponding memory vault 110.

The MVC 106 may also include an out-of-order request queue 318. The out-of-order request queue 318 establishes an ordered sequence of read and/or write operations to the plurality of memory banks included in the memory vault 110. The ordered sequence is chosen to avoid sequential operations to any single memory bank in order to reduce bank conflicts and to decrease read-to-write turnaround time.

The MVC 106 may also include an error tracker such as a memory vault error logic (MVEL) component 324. The MVEL 324 may track multiple error rates for multiple portions of the memory cells of the 3D memory array 200. Use of error rate data is discussed in more detail below. The error rate for a number of different portions can be tracked using the MVEL 324. In one example, error rates are tracked for each die 204. Other examples include tracking error rates for each tile 205, each array 203, etc.

In one example, the portion being tracked is dynamic. For example, if a die 204 has an error rate that exceeds a threshold, then a portion within the die 204 may be selected for tracking. In another example, if an error rate is below a threshold error rate in a portion such as a tile, then the MVEL may only track an error rate for the vault that includes that tile. In one example, tracked error rate information for a portion of the 3D memory array 200 is used to adjust (e.g., vary) refresh rates in selected portions.

FIG. 3 shows an embodiment including a memory map 315. The memory map 315 keeps track of various portions within the 3D memory array 200, and tracks one or more characteristics that is specific to a particular tracked portion. Examples include tracking one or more characteristics for individual dies 204, vaults 230, tiles 205, or other groupings of a number of memory cells of the 3D memory array 200. In one example the memory map 315 keeps track of such information for more than one portion concurrently.

Examples of characteristics for each portion to be tracked include, but are not limited to, error rate, temperature, power down state, and refresh rate. In one embodiment, refresh rate is determined using one or more of the other characteristics tracked in the memory map 315.

In an example embodiment, the memory map 315 is located within local storage that is coupled to the memory device. Using one example of a 3D memory array, the memory map 315 is located on the logic chip 202 which is directly coupled to the 3D memory array 200. In one example, the memory map is stored in non-volatile memory, such as flash memory on the logic chip 202. Having the memory map 315 stored locally on the memory device 100 within a locally attached logic chip 202 allows the memory device 100 to optimize memory operation independent of the processor 114. Examples of feedback characteristics for use in memory optimization are listed above (error rate, temperature, power down state, and refresh rate).

In one example, each MVC 106 includes a separate memory map 315, although the invention is not so limited. Other embodiments include a single memory map 315 on the logic chip 202 to serve the 3D memory array 200, or other numbers of memory maps 315.

In one embodiment, the memory map 315 is dynamic, and changes based on one or more feedback characteristics, such as the examples listed above. Using temperature as an example characteristic, one or more portions of the 3D memory array 200 may be operating at a different temperature. In response, the memory map 315 allows the different portions to be treated differently according to their temperature. For example, a hotter die 204 may be mapped to a more frequent refresh rate as needed than a cooler die 204. In a dynamic memory map 315, if the respective local temperatures change during operation, the memory map can also be changed. As discussed above, other portions such as vaults, tiles, etc. can also be monitored and adjusted.

Using a power down state example, one or more portions of the 3D memory array 200 may be operating in a different power down state. In response, the memory map 315 allows the different portions to be treated differently according to their power down state. For example, a vault 230 that has not been recently accessed, may be in a power down state that requires refreshing, but not at as high a refresh rate as vaults 230 that are currently being accessed. Other fast response time power states for other vaults 230 may be mapped to a higher refresh rate. In a dynamic memory map 315, as the power down states of various portions change during operation, the memory map can also be changed. As discussed above, other portions such as dies, tiles, etc. can also be monitored and adjusted.

Using an error rate example, one or more portions of the 3D memory array 200 may be experiencing different error rates. In response, the memory map 315 allows the different portions to be treated differently according to their error rates. For example, a tile 205 that is experiencing a high error rate may be mapped to a higher refresh rate, while a tile 205 that is experiencing a low error rate may be mapped to a lower refresh rate. In a dynamic memory map 315, if error rates of various portions change during operation, the memory map can also be changed. As discussed above, other portions such as dies, vaults, etc. can also be monitored and adjusted.

In one example, in addition to adjusting a characteristic such as refresh rate, if an error rate threshold for a portion is exceeded, that portion of the 3D memory array 200 is disabled, and the memory map 315 keeps track of the disabled portion, leaving the rest of the 3D memory array 200 to function normally. In one example, the error rate of a selected portion can be used to provide a health monitor rating, with the ability to predict imminent failure. For example, in one embodiment, if the error rate for a particular portion or portions exceeds a threshold, a health monitor rating can be provided to indicate a need for replacement of the memory device.

Although each example characteristic is discussed above individually as it affects refresh rate, the invention is not so limited. In one example, multiple characteristics such as temperature, power down state, and error rate are tracked concurrently and their effects are combined to provide an optimized refresh rate for a portion of the 3D memory array 200.

In addition to the dynamic memory map example above, in one embodiment, the memory map 315 is static. One example of a static memory map includes a memory map that is generated only once upon each power up of a system, such as a personal computer. After each power up evaluation, a static memory map example may not monitor for feedback characteristics. Another static example includes a test after fabrication. The memory map 315 may include a fixed map of performance or other characteristics within the selected portions that exist inherently after fabrication, resulting from factors such as variations in silicon, lithography defects, etc. In the fabrication example, the static memory map 315 including a number of different refresh rates is created once after fabrication to optimize the 3D memory array 200 in light of such variation.

Figure 4:
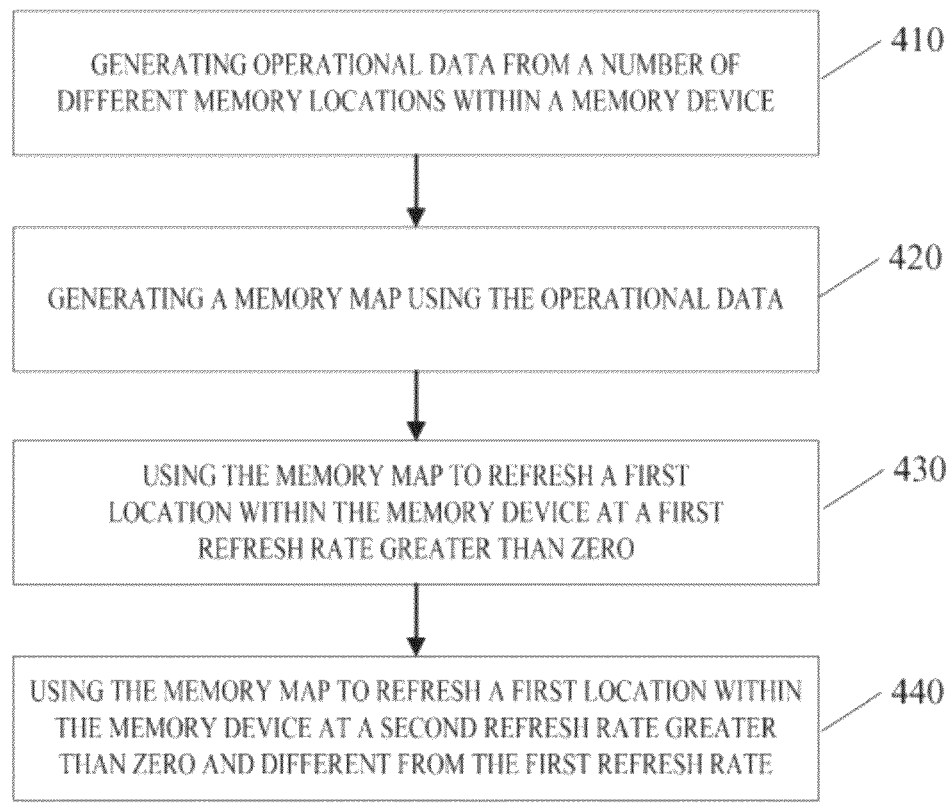
FIG. 4 shows a flow diagram of a method of operating a memory device according to an embodiment of the invention.

FIG. 4 shows an example method of operation of a memory device as discussed in embodiments above. In operation 410, operational data is generated for a number of different portions of a memory device. Examples of such portions includes the various portions discussed in embodiments above. Examples of operational data includes characteristics such as temperature, power down state, error rate, etc. discussed in embodiments above.

In operation 420, a memory map is generated using the operation data. In operation 430, the memory map is used to refresh a first portion of the memory device at a first refresh rate greater than zero. In operation 440, the memory map is used to refresh a second portion of the memory device at a second refresh rate greater than zero and different from the first data rate. In addition to the two or more refresh rates discussed that are greater than zero, in selected examples, other portions may not be refreshed at all.

In addition to operation in conjunction with a memory map 315 as described above, the MVEL 324 may also perform defective memory array address remapping operations using array repair logic 326. The array repair logic 326 may remap requests to redundant cells or arrays of cells located on memory vaults or dies, etc. (e.g., on the stacked die 204 of FIG. 2) and/or on the logic die 202 (e.g., the spare array 327). The MVEL 324 may also perform TWI repair operations associated with the corresponding memory vault 110 using TWI repair logic 328.

The apparatus and systems of various embodiments may be useful in applications other than a high-density, multi-link, high-throughput semiconductor memory subsystem. Thus, various embodiments of the invention are not to be so limited. The illustrations of the memory device 100 are intended to provide a general understanding of the structure of various embodiments. They are not intended to serve as a complete description of all the elements and features of apparatus and systems that might make use of the structures described herein.

The novel apparatus and systems of various embodiments may comprise or be incorporated into electronic circuitry used in computers, communication and signal processing circuitry, single-processor or multi-processor modules, single or multiple embedded processors, multi-core processors, data switches, and other information handling systems.

Examples of such systems, include, but are not limited to televisions, cellular telephones, personal data assistants (PDAs), personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Figure 5:
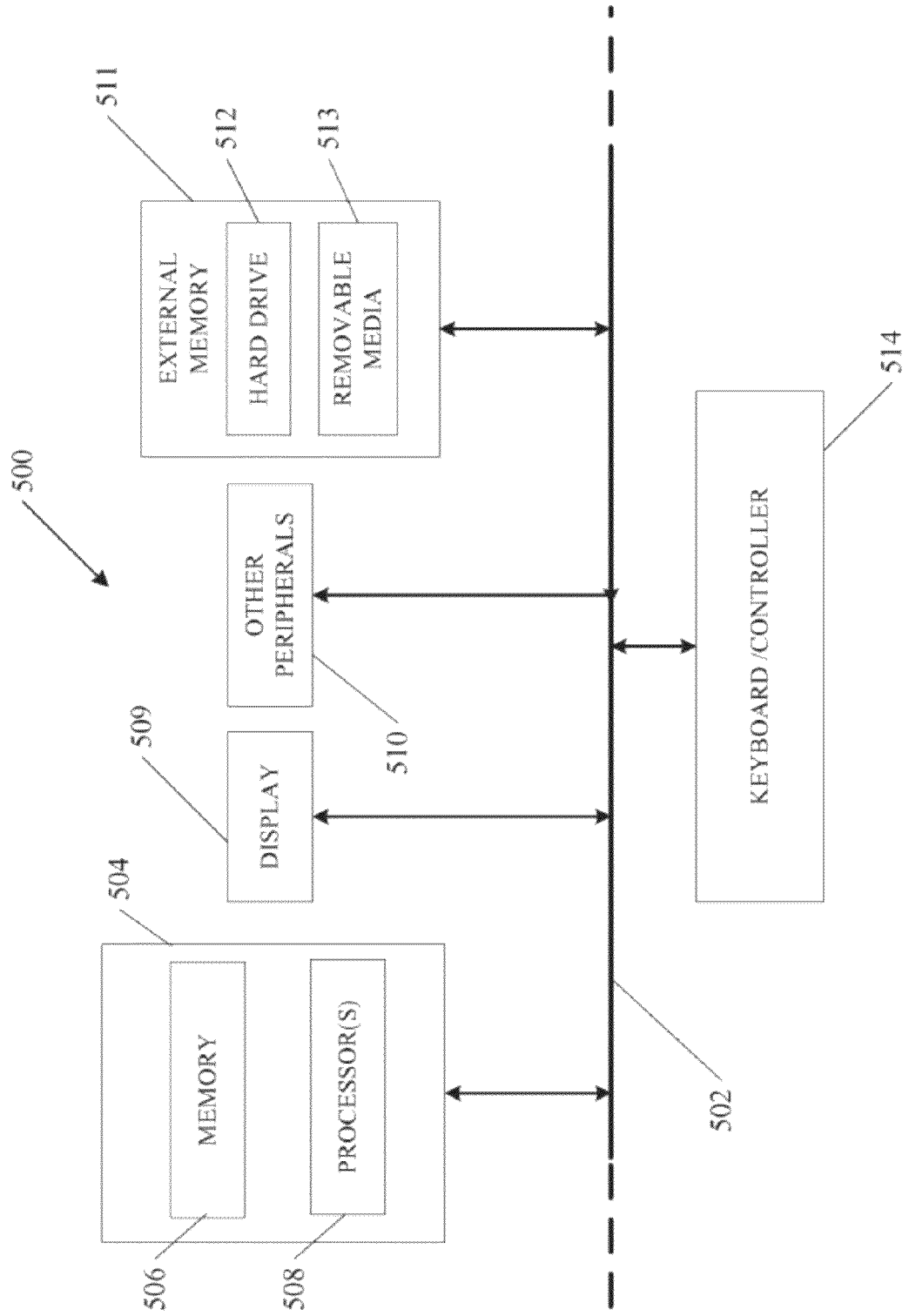
FIG. 5 shows a block diagram of a higher level information handling system according to an embodiment of the invention.

A high level example of a personal computer is included in FIG. 5 to show a higher level device application for the present invention. FIG. 5 is a block diagram of an information handling system 500 incorporating at least one memory device 506 according to an embodiment of the invention.

In this example, information handling system 500 comprises a data processing system that includes a system bus 502 to couple the various components of the system. System bus 502 provides communications links among the various components of the information handling system 500 and may be implemented as a single bus, as a combination of busses, or in any other suitable manner.

Chip assembly 504 is coupled to the system bus 502. Chip assembly 504 may include any circuit or operably compatible combination of circuits. In one embodiment, chip assembly 504 includes a processor 508 or multiple processors that can be of any type. As used herein, "processor" means any type of computational circuit such as, but not limited to, a microprocessor, a microcontroller, a graphics processor, a digital signal processor (DSP), or any other type of processor or processing circuit. As used herein, "processor" includes multiple processors or multiple processor cores.

In one embodiment, a memory device 506 is included in the chip assembly 504. Those skilled in the art will recognize that a wide variety of memory device configurations may be used in the chip assembly 504. A memory device such as a DRAM that is continually refreshed during operation is described in embodiments above. One example of a DRAM device includes a stacked memory chip 3D memory device with an integrated logic chip as described in embodiments above. Memory 506 can also include non-volatile memory such as flash memory.

Information handling system 500 may also include an external memory 511, which in turn can include one or more memory elements suitable to the particular application, such as one or more hard drives 512, and/or one or more drives that handle removable media 513 such as flash memory drives, compact disks (CDs), digital video disks (DVDs), and the like.

Information handling system 500 may also include a display device 509 such as a monitor, additional peripheral components 510, such as speakers, etc. and a keyboard and/or controller 514, which can include a mouse, trackball, game controller, voice-recognition device, or any other device that permits a system user to input information into and receive information from the information handling system 500.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon reviewing the above description.

What is claimed is:

1. A memory device, comprising:
a number of memory cells within a stacked memory array;
a logic die to manage refresh rates in the stacked memory array; and
a tracker to track a power down state for different portions, wherein the tracked power down states are used to refresh different portions within the stacked memory array at different refresh rates.

2. The memory device of claim 1, wherein the tracker further tracks an error rate in the different portions.

3. The memory device of claim 2, wherein the tracker further includes logic to utilize a redundant memory region if an error rate in one or more different portions falls below a selected error rate.

4. The memory device of claim 1, wherein the tracker further includes interconnect repair logic to re-route memory operations around defective through wafer interconnects.

5. The memory device of claim 1, wherein the logic die is attached to the stack of memory dies.

6. A memory device, comprising:
a number of memory cells within a stacked memory array;
a logic die to manage refresh rates in the stacked memory array; and
an error tracker to track an error rate for different portions, wherein the tracked error rate is used to refresh different portions within the stacked memory array at different refresh rates.

7. The memory device of claim 6, wherein the refresh rate of the respective one of the portions is also adjusted using another characteristic of the memory device.

8. The memory device of claim 7, wherein the other characteristic includes a sensed temperature of the respective one of the portions.

9. The memory device of claim 7, wherein the other characteristic includes a power down state for the different portions.

10. A memory device, comprising:
a stack of memory dies;
a logic die to manage refresh rates in the stack of memory dies; and
a memory map generated by sensed data from operation of the number of memory cells, to refresh different variable sized portions within the stack of memory dies at different refresh rates.

11. The memory device of claim 10, wherein the different refresh rates are set at manufacture of the memory device.

12. The memory device of claim 10, wherein the different refresh rates are set at power up of the memory device.

13. The memory device of claim 10, wherein the different refresh rates are based on error rate.

14. The memory device of claim 10, wherein the logic die is attached to the stack of memory dies.

15. The memory device of claim 10, wherein the memory map is configured such that a first die in the stack of memory dies can be refreshed at a different rate from a second die in the stack of memory dies.

16. The memory device of claim 10, wherein the memory map is configured such that a first vault in the stack of memory dies can be refreshed at a different rate from a second vault in the stack of memory dies.

17. The memory device of claim 10, wherein the memory map is configured such that a first tile in the stack of memory dies can be refreshed at a different rate from a second tile in the stack of memory dies.

* * * * *